(12) United States Patent
Choi et al.

(10) Patent No.: US 10,318,031 B2
(45) Date of Patent: Jun. 11, 2019

(54) DISPLAY APPARATUS INTEGRATED WITH A TOUCH SCREEN PANEL AND INCLUDING A GUARD RING PATTERN

(71) Applicant: SAMSUNG DISPLAY CO., LTD., Yongin-si, Gyeonggi-do (KR)

(72) Inventors: Myung-Wook Choi, Cheonan-si (KR); Sung Ho Cho, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 42 days.

(21) Appl. No.: 15/471,190

(22) Filed: Mar. 28, 2017

(65) Prior Publication Data
US 2017/0277320 A1 Sep. 28, 2017

(30) Foreign Application Priority Data
Mar. 28, 2016 (KR) .................. 10-2016-0037189

(51) Int. Cl.
*G06F 3/041* (2006.01)
*G06F 3/044* (2006.01)
*G02F 1/1333* (2006.01)
*H01L 27/32* (2006.01)

(52) U.S. Cl.
CPC ............ *G06F 3/0412* (2013.01); *G06F 3/044* (2013.01); *G02F 1/13338* (2013.01); *G06F 2203/04107* (2013.01); *G06F 2203/04111* (2013.01); *H01L 27/323* (2013.01)

(58) Field of Classification Search
CPC .................. G06F 3/0412; G06F 3/044; G06F 2203/04107; G06F 2203/041111; H01L 27/3272
See application file for complete search history.

(56) References Cited

U.S. PATENT DOCUMENTS

2014/0028582 A1* 1/2014 Choi .................. G06F 3/041
345/173

FOREIGN PATENT DOCUMENTS

| JP | 2012-098840 | 5/2012 |
|---|---|---|
| KR | 10-2014-0013482 | 2/2014 |
| KR | 10-2015-0081006 | 7/2015 |
| KR | 10-2015-0128558 | 11/2015 |

\* cited by examiner

*Primary Examiner* — Lisa S Landis
(74) *Attorney, Agent, or Firm* — F. Chau & Associates, LLC

(57) ABSTRACT

A display device integrated with a touch screen panel including a first substrate, a first guard ring pattern, an insulating layer, and a second guard ring pattern. The first substrate includes a touch region. The first guard ring pattern is positioned at a perimeter of the touch region. The insulating layer is positioned at a perimeter of the first guard ring pattern. The insulating layer is separated from an edge of the first substrate by a first distance. The second guard ring pattern is positioned over each of the first substrate and the insulating layer.

19 Claims, 7 Drawing Sheets

DISPLAY APPARATUS INTEGRATED WITH A TOUCH SCREEN PANEL AND INCLUDING A GUARD RING PATTERN

CROSS-REFERENCE TO RELATED APPLICATION

This application claims priority under 35 U.S.C. § 119 to Korean Patent Application No. 10-2016-0037189 filed on Mar. 28, 2016 in the Korean Intellectual Property Office, the disclosure of which is incorporated by reference herein in its entirety.

TECHINICAL FIELD

Exemplary embodiments of the present invention relate to a display apparatus, and more particularly to a display apparatus integrated with a touch screen panel.

DISCUSSION OF RELATED ART

Display devices may include a touch screen panel and a display panel. The touch screen panel may be used for user interaction. The display panel may display an image. When a user approaches or contacts an object such as a finger or a touch pen onto a screen of the display device, the touch screen panel may sense a change of pressure, charge, or light applied to the display device. Thus, contact information may be obtained by the display device such as whether an object approaches or contacts a screen and a contact position thereof.

The touch screen panel may replace a separate input device that is connected to the display device. The separate input device may be a keyboard or a mouse. Accordingly, a use of a separate input device connected to the display device is expanding.

The touch screen panel may be a resistive type, a capacitive type, an electro-magnetic type (EM), or an optical type. The capacitive type of touch screen panel may convert a contact position into an electrical signal when an object contacts the touch screen panel. The contact position may be converted into the electrical signal by sensing a change of capacitance formed by a conductive sensing pattern with respect to other sensing patterns or a ground electrode.

The touch screen panel may be separately manufactured to be attached to a surface of the display panel. The display panel may be a liquid crystal display or an organic light-emitting diode display. However, when the separately manufactured touch screen panel and the display panel are attached to each other, an overall thickness of the display device and a manufacture cost thereof may increase.

During the manufacturing process of the touch screen panel, an inner circuit of the touch screen panel may be damaged by static electricity generated during product transportation or a use process. Thus, a possibility of malfunction may be caused.

SUMMARY

An exemplary embodiment of the present invention provides a display apparatus, and more particularly a display apparatus integrated with a touch screen panel. Thus, an influence of static electricity applied from the outside to the display apparatus may be reduced or eliminated. Additionally, a thickness of a display panel of the display apparatus may be reduced and an image visibility of the display panel may be increased.

A display apparatus integrated with a touch screen panel includes a first substrate, a first guard ring pattering, an insulating layer, and a second guard ring pattern. The first substrate includes a touch region. The first guard ring pattern is positioned at a perimeter of the touch region. The insulating layer is positioned at a perimeter of the first guard ring pattern. The insulating layer is separated from an edge of the first substrate by a first distance. The second guard ring pattern is positioned over each of the first substrate and the insulating layer.

A plurality of sensing patterns may be positioned at the touch region. A bonding pad part may be positioned at a first region. The bonding pad part may be connected to an external driving circuit. The external driving circuit may be configured to drive the sensing patterns. The display device may include a plurality of sensing lines. The sensing lines may connect the sensing patterns and the bonding pad part to each other. The first region may be a peripheral area of the touch region.

The display device may include a third guard ring pattern. The third guard ring pattern may be in direct contact with the first guard ring pattern through a contact hole positioned in the insulating layer in a position corresponding to a position of the first guard ring pattern.

The second guard ring pattern may be separated from the third guard ring pattern by a predetermined interval.

The second guard ring pattern and the third guard ring pattern may be integrally formed. The second guard ring pattern and the third guard ring pattern may each include a metal material having a relatively low resistance.

The second guard ring pattern may be connected to the third guard ring pattern in the first region.

The second guard ring pattern may be positioned at the perimeter of the insulating layer at a second region in which the bonding pad part is positioned. The second region may exclude the first region.

The sensing lines and the first guard ring pattern may each include a metal material having a relatively low resistance.

The bonding pad part may include a ground terminal. The first guard ring pattern may be connected to the ground terminal.

The sensing patterns may each include a plurality of first sensing cells, a plurality of first connection lines, a plurality of second sensing cells, and a plurality of second connection lines. The first sensing cells may be positioned along a first direction to be connected for each row of the sensing patterns positioned in the touch region. The first connection lines connect the first sensing cells to each other along the first direction. The second sensing cells may be positioned along a second direction to be connected for each column of the sending patterns positioned in the touch region. The second connection lines may connect the second sensing cells to each other along the second direction. The second direction may cross the first direction.

The second guard ring pattern may be separated from the edge of the first substrate by a second distance. The second distance may be smaller than the first distance.

The display device may include a second substrate and a sealant. The second substrate may include a plurality of display elements. The second substrate may be disposed below the first substrate. The sealant may be configured to seal each of the first substrate and the second substrate. The sealant may be configured to enclose the display elements.

A display device integrated with a touch screen panel includes a first substrate, an insulating layer, and a first guard ring pattern. The first substrate includes a touch region. The insulating layer is separated from an edge of the first substrate by a first distance. The first guard ring pattern is disposed on each of the first substrate and the insulating layer. The first guard ring pattern is configured to enclose an end of the insulating layer.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
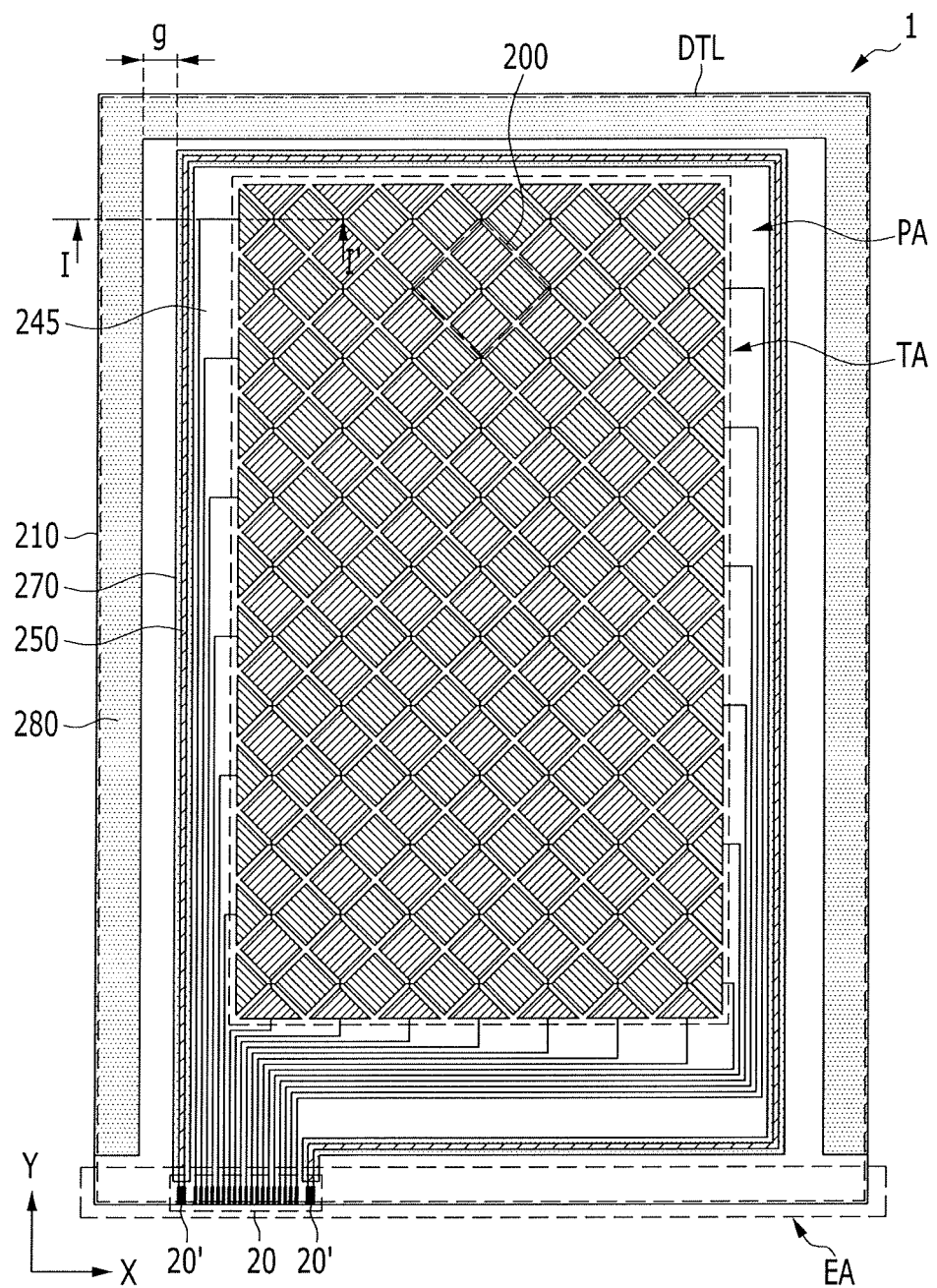
FIG. 1 is a top plan view illustrating a display device integrated with a touch screen panel according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

Figure 2:
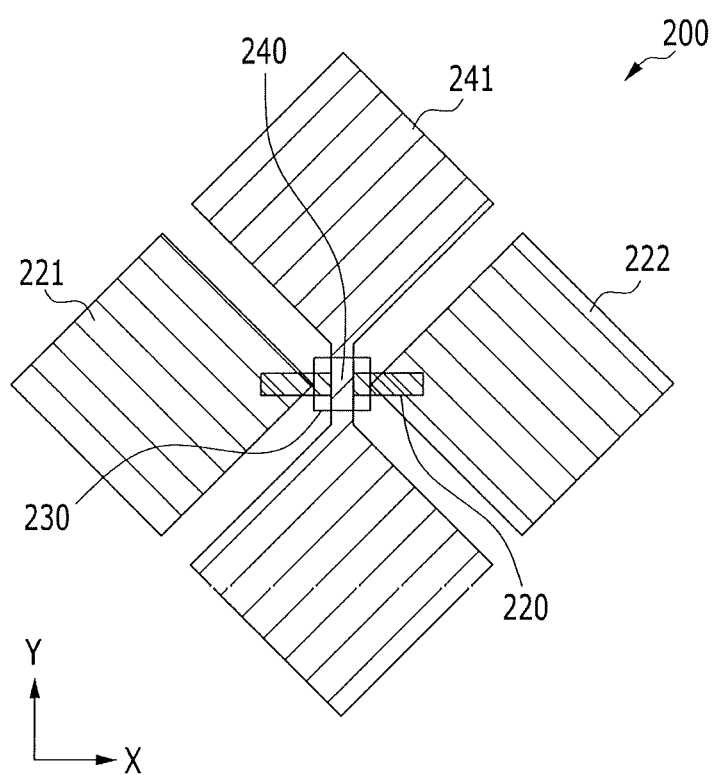
FIG. 2 is an enlarged view illustrating a sensing pattern included in a display device integrated with a touch screen panel according to an exemplary embodiment of the present invention.

FIG. 1 is a top plan view illustrating a display device integrated with a touch screen panel according to an exemplary embodiment of the present invention. FIG. 2 is an enlarged view illustrating a sensing pattern included in a display device integrated with a touch screen panel according to an exemplary embodiment of the present invention.

An exemplary embodiment of the present invention is directed to a display device 1. The display device 1 may include a display panel and a touch screen panel. The display panel and the touch screen panel may be integrated with each other. The touch screen panel may be disposed on a surface of a first substrate 210 of the display panel. The display panel may be a panel included in an organic light-emitting diode display or a liquid crystal display. A display panel according to an exemplary embodiment of the present invention described in more detail below may be an organic light-emitting diode display.

Referring to FIG. 1, the touch screen panel may be positioned at an outer surface of the first substrate 210. The touch screen panel may include a plurality of sensing patterns 200. The sensing patterns 200 may be disposed on an upper surface of the first substrate 210. The touch screen panel may include a transparent substrate configured to serve as an encapsulation substrate. The touch screen panel may include a plurality of sensing lines 245. The sensing lines 245 may connect the sensing patterns 200 to an external driving circuit, for example, through a bonding pad part 20.

A region in which the sensing patterns 200 are disposed may be a touch region TA. The touch region TA may be configured to detect a touch position. A region in which the sensing lines 245 are electrically connected to each of the sensing patterns 200 and the bonding pad part 20 may be a peripheral area PA. The peripheral area PA may be positioned outside the touch region TA. The peripheral area may be a region defined by a dotted line DTL (see, e.g., FIG. 1), excluding the touch region TA.

According to a maximization of the touch region TA in which touch recognition may be performed, a width of the peripheral area PA positioned at the outside of the touch region TA may be narrowed.

Exemplary embodiments of the present invention are not limited to particular positions of the touch screen panel and the display panel. For example, the touch screen panel may be positioned at an inside surface of the first substrate 210. A first part including the sensing pattern 200 of the touch screen panel among the sensing cells may be positioned at an inner surface of the first substrate 210. A second part not overlapping the first part may be positioned at the outer surface of the first substrate 210.

The first substrate 210 may be an encapsulation substrate of the display panel. The first substrate 210 may include a transparent material. When the display device is a flexible display device, the first substrate 210 may include a film having a flexible characteristic. The first substrate 210 may include a plurality of thin films. The thin film may include a polyimide resin, an epoxy based rein, or a material having flexibility.

A first guard ring pattern 250 may be positioned to substantially enclose the perimeter of the sensing lines 245. The first guard ring pattern 250 may be positioned at a perimeter of the touch region TA. The first guard ring pattern 250 may be connected to a ground terminal 20' of the bonding pad part 20.

The first guard ring pattern 250 may include a metal material. The metal material may have a relatively low resistance. The metal material may also be substantially the same material included in the sensing lines 245. Thus, a malfunction of the touch screen panel by static electricity applied from the outside or the sensing pattern may be reduced or prevented. Additionally, damage to the inner circuit may be reduced or prevented.

To minimize an influence of the static electricity applied from the outside, a width of the first guard ring pattern 250 may be relatively wide. However, the width of the first guard ring pattern 250 may be relatively narrowly formed as the width of the peripheral area PA decreases.

The display device integrated with the touch screen panel 1 according to an exemplary embodiment of the present invention may include a second guard ring pattern 270. The display device integrated with the touch screen panel 1 may include a third guard ring pattern 280.

The second guard ring pattern 270 may include a transparent conductive material. The second guard ring pattern 270 may be positioned on the first guard ring pattern 250. The second guard ring pattern 270 may be directly connected to the first guard ring pattern 250. The second guard ring pattern 270 may be disposed on a different layer from the first guard ring pattern 250. Thus, a wiring thickness of the first guard ring pattern 250 may be increased such that a similar effect to reduce the resistance value of the first guard ring pattern 250 may occur.

The third guard ring pattern 280 may include substantially a same material as the second guard ring pattern 270. The third guard ring pattern 280 may be positioned at the periphery of the first guard ring pattern 250. The third guard ring pattern 280 may be separated from the second guard ring pattern 270, for example, by a predetermined interval "g" on a plane.

The third guard ring pattern 280 may be positioned at a region except for one edge region EA in which the bonding pad part 20 of the first substrate 210 is positioned. For example, the third guard ring pattern 280 may have a shape of which a part is opened (e.g., a 'C' shape). The third ring guard pattern 280 may be disposed at the edge of the first substrate 210. The first substrate 210 may have a rectangular shape. The third guard ring pattern 280 may be disposed at an outermost edge of the first substrate 210. Thus, static electricity applied from the outside may be attracted to the third guard ring pattern 280.

The display device integrated with the touch screen panel 1 may reduce or prevents a static electricity inflow into the display panel and may reduce or eliminate the influence of the static electricity on the display panel.

The static electricity that is not induced to the third guard ring pattern 280 may be attracted to each of the first guard ring pattern 250 and the second guard ring pattern 270. Thus, the static electricity may be dissipated to a ground terminal 20' of the bonding pad part 20. The bonding pad part 20 may be connected to the first guard ring pattern 250. Accordingly, the inflow of the static electricity into the display panel may be reduced or prevented. Thus, the influence of the static electricity on the display panel may be reduced or eliminated.

A structure of the touch screen panel according to an exemplary embodiment of the present invention will be described in more detail below with reference to FIGS. 1 and 2.

Referring to FIGS. 1 and 2, the sensing patterns 200 may include a plurality of first sensing cells 221 and 222, a first connection line 220, second sensing cells 241, a second connection line 240, and a first insulating layer 230. The first sensing cells 221 and 222 may be connected to each other for each row of sensing patterns 200 positioned in the touch region TA along a first direction (e.g., an X-axis direction). The first connection line 220 may connect the first sensing cells 221 and 222 to each other along the first direction. The second sensing cells 241 may be connected to each other for each column of sensing patterns 200 positioned in the touch region TA along a second direction (e.g., a Y-axis direction). The second connection line 240 connect the second sensing cells 241 to each other along the second direction. The first insulating layer 230 may be configured to maintain stability between the first connection lines 220 and the second connection lines 240.

The first sensing cells 221 and 222 and the second sensing cells 241 may be alternately disposed, for example, to not overlap with each other. The first connection line 220 and the second connection line 240 may cross each other. The first sensing cells 221 and 222 and the second sensing cells 241 might not be in direct contact with each other. The first sensing cells 221 and 222 may be disposed on substantially the same plane as the second sensing cells 241.

The first sensing cells 221 and 222 and the second sensing cells 241 may be integrally formed with the first connection line 220. The second connection line 240 may include a transparent electrode material such as indium-tin-oxide (ITO). Alternatively, the second connection line 240 may be formed separately from each of the first sensing cells 221 and 222 and the second sensing cells 241. For example, the second connection line 240 may be electrically connected to each of the first sensing cells 221 and 22 and the second sensing cells 241.

The second sensing cells 241 may be integrally patterned and formed with the second connection line 240, for example, in the second direction (e.g., the Y-axis direction). The first sensing cells 221 and 222 may be respectively patterned between the second sensing cells 241. The first sensing cells 221 and 222 may be connected by the first connection line 220. The first connection line 220 may be positioned on or under the patterned first sensing cells 221 and 222, for example, along the first direction (e.g., the X-axis direction).

The first connection line 220 may be integrally formed and connected with each of the first sensing cells 221 and 222. The first connection line 220 may be directly in contact with each of the first sensing cells 221 and 222, for example, through a contact hole.

The first connection lines 220 may include a transparent electrode material such as ITO. Alternatively, the first connection lines 220 may include an opaque material. The opaque material may have a relatively low resistance.

The sensing lines 245 may be connected to each of the first sensing cells 221 and 222 and the second sensing cells 241, respectively. The first sensing cells 221 and 222 may form a row line unit in the touch region TA. The second sensing cells 241 may form a column line unit in the touch region TA. The sensing lines 245 may connect the first sensing cells 221 and 222 and the second sensing cells 241 to an external driving circuit, for example, through the bonding part 20. The external driving circuit may be a position detection circuit.

The sensing lines 245 may be positioned in the peripheral area PA. The sensing lines 245 may include a relatively low resistance material such as ITO, molybdenum (Mo), silver (Ag), titanium (Ti), copper (Cu), aluminum (Ti), or molybdenum/aluminum/molybdenum (Mo/Al/Mo).

The touch screen panel described herein may be a capacitive type touch screen panel. Thus, if an object such as a hand or a stylus pen is in contact therewith, the change of capacitance depending on the contact position may be transmitted from the sensing pattern 200 to the driving circuit side through the sensing lines 245 and the bonding pad part 20.

The display device integrated with the touch screen panel 1 according to an exemplary embodiment of the present invention will be described in more detail below with reference to FIG. 3.

Figure 3:
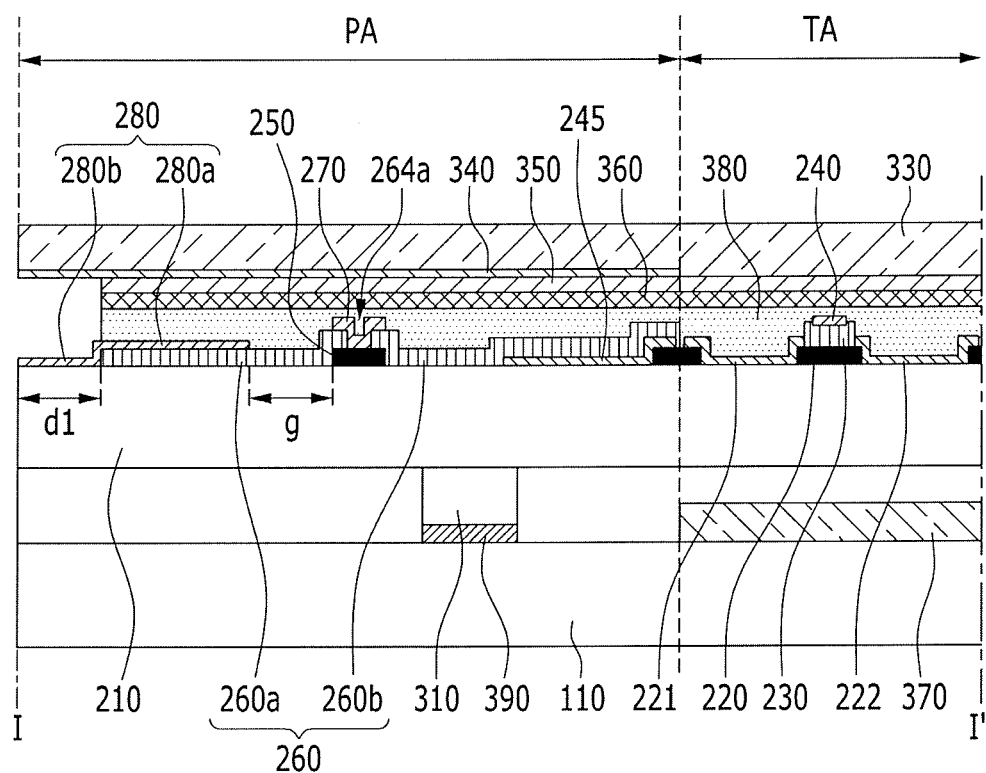
FIG. 3 is a cross-sectional view illustrating a region of a display device integrated with a touch screen panel taken along a line I-I' of FIG. 1 according to an exemplary embodiment of the present invention.

FIG. 3 is a cross-sectional view illustrating a region of a display device integrated with a touch screen panel taken along a line I-I' of FIG. 1 according to an exemplary embodiment of the present invention. The display panel may include a second substrate 110, a first substrate 210, a sealant 310, and a bonding layer 390. The first substrate 210 may substantially cover the second substrate 110. The sealant 310 may be disposed between the second substrate 110 and the first substrate 210.

A display element 370 may be disposed on the second substrate 110. The display element 370 may be positioned in the touch region TA. The display element 370 may include an organic light-emitting element and a thin film transistor.

The first substrate 210 may block external moisture or air from entering the display element 370. A polarization film may be disposed on the first substrate 210. A color filter may be disposed on the first substrate 210.

While the display element 370 of the second substrate 110 is enclosed, the sealant 310 and the bonding layer 390 may each be disposed on the second substrate 110.

The sealant 310 may include an inorganic material or an organic material, for example, a frit or an epoxy. The sealant 310 may be coated by a dispenser or by screen printing.

The bonding layer 390 may reinforce a bonding force of the second substrate 110 and the sealant 310. The bonding layer 390 may reduce or eliminate peeling between the sealant 310 and the second substrate 110 caused, for example, by an external impact.

If the static electricity inflows to the sealant 310 and the bonding layer 390, heat may be generated by the static electricity. The heat generated by the static electricity may cause the peeling in at least one position between the first substrate 210 and the sealant 310. Peeling between the sealant 310 and the bonding layer 390, and between the bonding layer 390 and the second substrate 110 may also occur.

To reduce or prevent the inflow of the static electricity to each of the sealant 310 and the bonding layer 390, the first guard ring pattern 250 may be positioned in the peripheral area PA of the first substrate 210.

A second insulating layer 260 may be disposed on each of the sensing lines 245, the first guard ring pattern 250, and the first substrate 210. The second insulating layer 260 may be disposed on the same layer as the first insulating layer 230 included in the sensing pattern 200.

A first insulating layer 260a may be positioned in a region separated from an outer edge I of the first substrate 210. The first insulating layer 260a may be separated by a first distance d1 from the first guard ring pattern 250. A second insulating layer 260b may extend from a region on the first guard ring pattern 250 to a region on the sensing line 245.

The second guard ring pattern 270 may be in direct contact with and connected to the first guard ring pattern 250, for example, through a contact hole 264a. The contact hole 264a may be formed in the insulating layer 260. A resistance value due to the bonding of the first guard ring pattern 250 and the second guard ring pattern 270 may be smaller than a resistance value of the first guard ring pattern 250. Accordingly, when the first guard ring pattern 250 is bonded with the second guard ring pattern 270 disposed on the first substrate 210, an ability to attract the static electricity through the first guard ring pattern 250 may be increased relative to when the first guard ring pattern 250 is solely disposed on the first substrate 210.

The third guard ring pattern 280 may be separated from the second guard ring pattern 270. The third guard ring pattern 280 may be positioned above the outer surface of each of the insulating layer 260a and the first substrate 210. The third guard ring pattern 280 may substantially enclose one end of the insulating layer 260a. The third guard ring pattern 280 may be positioned at the region separated from the outer edge I by the first distance d1.

The third guard ring pattern 280 may be disposed on the outer edge I of the first substrate 210. Thus, the static electricity that may inflow to a side of the first substrate 210 through the edge I may be attracted to the third guard ring pattern 280. The third guard ring pattern 280 may reduce or prevent the static electricity from inflowing to the first substrate 210.

The display device integrated with the touch screen panel 1 including the first to third guard ring pattern 250, 270 and 280 may reduce or prevent the static electricity inflow to the display panel side. Additionally, the influence of the static electricity on the display panel may be reduced or eliminated.

A polarizer 360 may be disposed on the touch screen panel. The polarizer 360 may be attached to the touch screen panel, for example, by a second adhesive layer 380.

A window substrate 330 may be disposed on the polarizer 360. The window substrate 330 may be configured to increase an instrument strength of the display device. The window substrate 330 may be attached to the polarizer 360, for example, by a first adhesive layer 350.

The first and second adhesive layers 350 and 380 may include a transparent adhesive material. The transparent adhesive material may have a relatively high light transmittance. The transparent adhesive material may include a SVR (Super View Resin) or an OCA (Optically Clear Adhesive).

A black matrix layer 340 may be positioned at the region of the window substrate 330 corresponding to and overlapping the peripheral area PA. Thus, the black matrix layer 340 may be configured to form the border of the touch region TA. The black matrix layer 340 may also reduce or prevent a pattern from being visible. For example, visibility of the sensing line 245 in the peripheral area PA may be reduced or prevented.

A touch screen panel according to an exemplary embodiment of the present invention will be described more detail below with reference to FIGS. 4 and 5.

Figure 4:
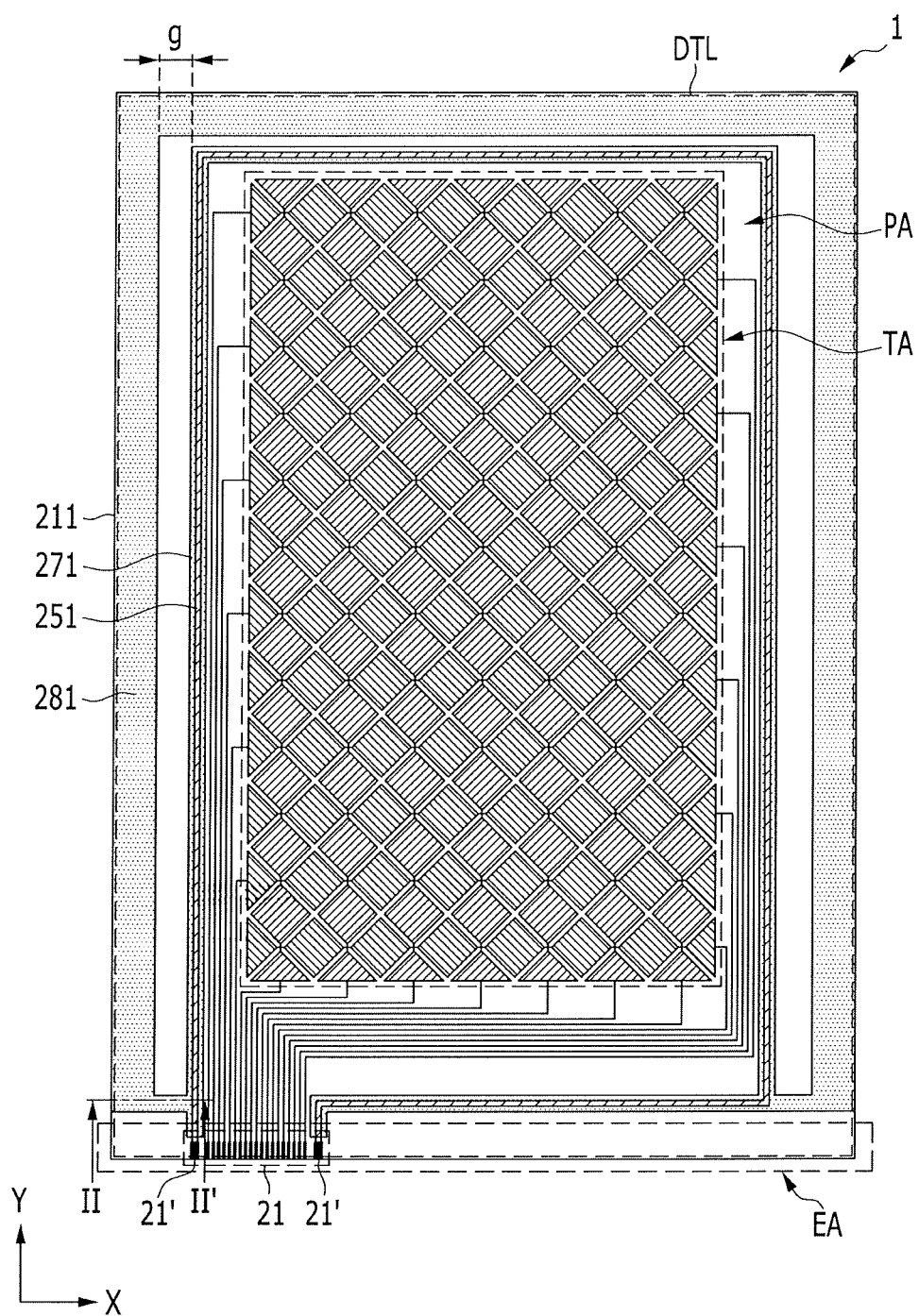
FIG. 4 is a top plan view illustrating a display device integrated with a touch screen panel according to an exemplary embodiment of the present invention.

FIG. 4 is a top plan view illustrating a display device integrated with a touch screen panel according to an exemplary embodiment of the present invention. FIG. 5 is a cross-sectional view illustrating a region of a display device integrated with a touch screen panel taken along a line II-II' of FIG. 4 according to an exemplary embodiment of the present invention.

Figure 5:
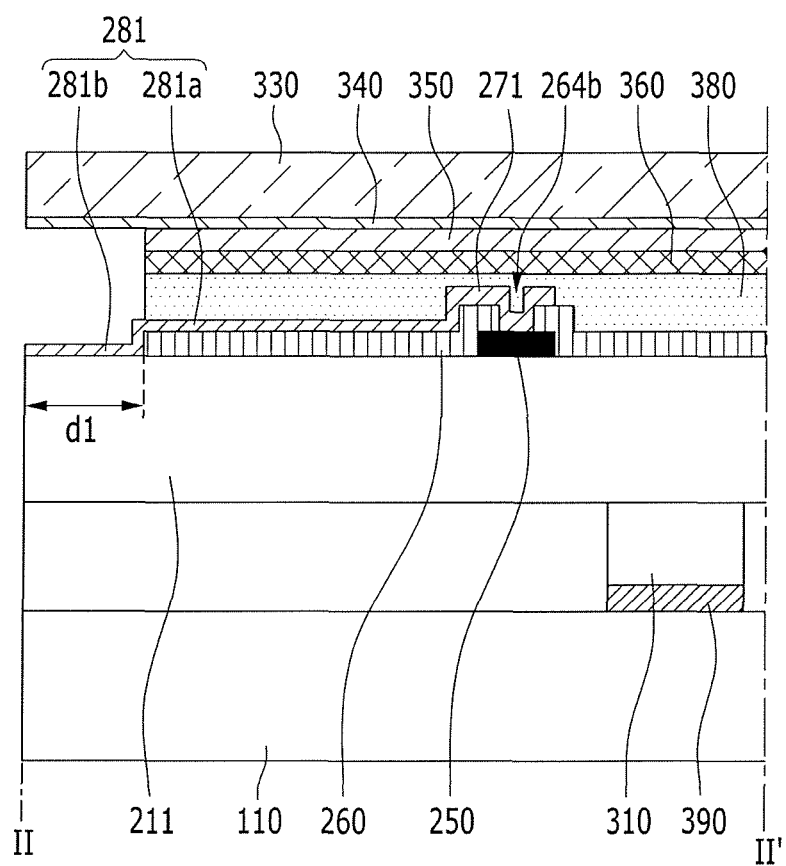
FIG. 5 is a cross-sectional view illustrating a region of a display device integrated with a touch screen panel taken along a line II-II' of FIG. 4 according to an exemplary embodiment of the present invention.

Referring to FIGS. 4 and 5 a second guard ring pattern 271 and a third guard ring pattern 281 may be directly connected to each other. Similar constituent elements as described with reference to FIGS. 1 to 3 may have the same reference numerals as those described below with reference to FIGS. 4 and 5 and thus descriptions thereof may be omitted.

Referring to FIG. 4, the display device integrated with the touch screen panel 1 according to an exemplary embodiment of the present invention may include the third guard ring pattern 281. The third guard ring pattern 281 may be directly connected to the second guard ring pattern 271.

The second guard ring pattern 271 may include the transparent conductive material. The second guard ring pattern 271 may be positioned on a first guard ring pattern 251. The second guard ring pattern 271 may be directly connected to the first guard ring pattern 251. The second guard ring pattern 271 may be disposed on a different layer from the first guard ring pattern 251.

The third guard ring pattern 281 may include substantially the same material as the second guard ring pattern 271. The third guard ring pattern 281 may be positioned at the periphery of the first guard ring pattern 251. The third guard ring pattern 281 may be positioned at the region except for one edge region EA in which a bonding pad part 21 of a first substrate 211 is positioned. The third guard ring pattern 281 may be positioned at the outermost edge of the first substrate 211. Thus, the static electricity applied from the outside may be attracted to the third guard ring pattern 281.

The third guard ring pattern 281 may be integrally formed with the second guard ring pattern 271. The third guard ring pattern 281 may be connected to the second guard ring pattern 271. The second guard ring pattern 271 and the third guard ring pattern 281 may be connected to each other near the edge region EA in which the bonding pad part 21 of the first substrate 211 is positioned. The third guard ring pattern 281 and the second guard ring pattern 271 may be separated from each other by the predetermined interval g in the rest of the edge region EA.

The second guard ring pattern 271 and the third guard ring pattern 281 may be connected to each other only in the edge region adjacent to a ground terminal 21' of the bonding pad part 21. The third guard ring pattern 281 might not be connected to the second guard ring pattern 271 in the region adjacent to the touch region TA. The third guard ring pattern 281 may be connected in the region adjacent to the ground terminal 21'. Thus, the static electricity may be dissipated to the ground terminal 21', for example, through each of the second guard ring pattern 271 and the first guard ring pattern 251.

The static electricity attracted to the third guard ring pattern 281 may be transmitted to the first guard ring pattern 251, for example, through the second guard ring pattern 271. Thus, the static electricity may be dissipated to the ground terminal 21' of the bonding pad part 21. Accordingly, the display device integrated with the touch screen panel 1 according to an exemplary embodiment of the present invention may reduce or prevent the static electricity inflow to the display panel side. The influence of the static electricity on the display panel may be reduced or eliminated.

The rest of the static electricity that is not attracted to the third guard ring pattern 281 may be attracted to each of the first guard ring pattern 251 and the second guard ring pattern 271. Thus, the static electricity may be dissipated to the ground terminal 21' of the bonding pad part 21 connected to the first guard ring pattern 251. Accordingly, since the inflow of the static electricity to the display panel side may be reduced or prevented, the influence of the static electricity on the display panel may be reduced or eliminated.

Referring to FIG. 5, the second guard ring pattern 271 may be in direct contact with the first guard ring pattern 251. The second guard ring pattern 271 may be connected to the first guard ring pattern 251, for example, through a contact hole 264b. The contact hole 264b may be formed in an insulating layer 261. A resistance value due to bonding of the first guard ring pattern 251 and the second guard ring pattern 271 may be smaller than a resistance value of the first guard ring pattern 251.

The third guard ring pattern 281 may be connected to the second guard ring pattern 271. The third guard ring pattern 281 may be disposed on the outer surface of each of the insulating layer 261 and the first substrate 211. The third guard ring pattern 281 may be disposed on the outer edge II of the first substrate 211.

The static electricity that may inflow to the side of the first substrate 211 through the edge II may be attracted to the third guard ring pattern 281. Thus, the third guard ring pattern 281 may reduce or prevent the static electricity inflowing into the first substrate 211.

The display device integrated with the touch screen panel 1 including the first to third guard ring patters 251, 271 and 281 may reduce or prevent the static electricity inflow to the side of the display panel. The influence of the static electricity on the display panel may be reduced or eliminated.

A touch screen panel according to an exemplary embodiment of the present invention will be described in more detail below with reference to FIGS. 6 and 7.

Figure 6:
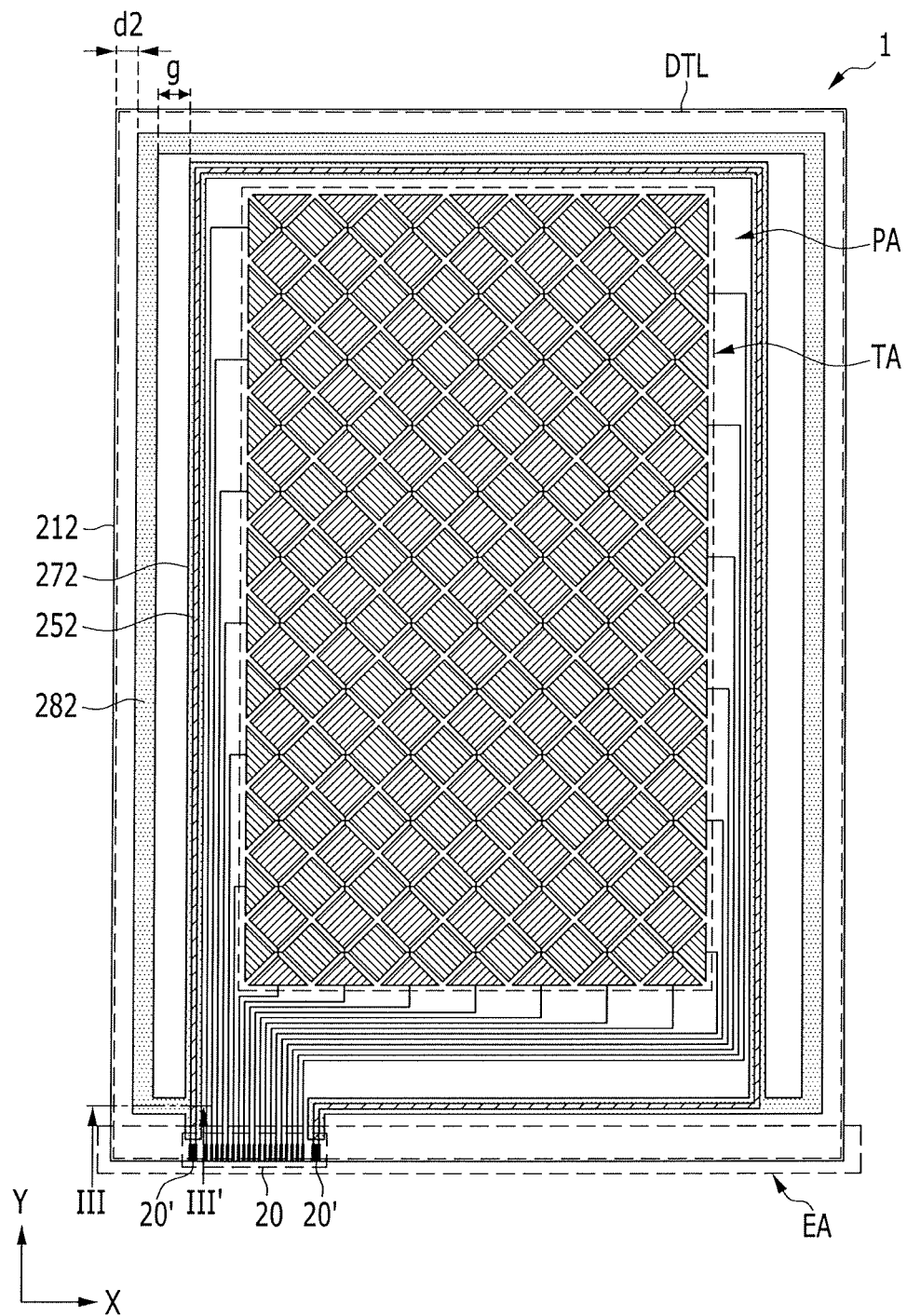
FIG. 6 is a top plan view illustrating a display device integrated with a touch screen panel according to an exemplary embodiment of the present invention.

FIG. 6 is a top plan view illustrating a display device integrated with a touch screen panel according to an exemplary embodiment of the present invention. FIG. 7 is a cross-sectional view illustrating a region of a display device integrated with a touch screen panel taken along a line III-III' of FIG. 6 according to an exemplary embodiment of the present invention.

Referring to FIG. 6, the display device integrated with the touch screen panel 1 according to an exemplary embodiment of the present invention may include a third guard ring pattern 282 and a second guard ring pattern 272. The third guard ring pattern 282 may be directly connected to the second guard ring pattern 272. The third guard ring pattern 282 may be separated from an outer edge III of a first substrate 212.

The second guard ring pattern 272 may include the transparent conductive material. The second guard ring pattern 272 may be disposed on a first guard ring pattern 252. The second guard ring pattern 272 may be directly connected to the first guard ring pattern 252. The second guard ring pattern 272 may be disposed on a different layer from the first guard ring pattern 252.

The third guard ring pattern 282 may include substantially a same material as the second guard ring pattern 272. The third guard ring pattern 282 may be positioned outside the first guard ring pattern 252. The third guard ring pattern 282 may be separated from each of the outer edge III of the second guard ring pattern 272 and the first substrate 212. The third guard ring pattern 282 may be positioned at the region separated from the outer edge III of the first substrate 212 by the second distance d2.

The outer edge III of the first substrate 212 may be a border line. The border line may divide each display panel from a mother substrate. The mother substrate may include multiple display panels. When the third guard ring pattern 282 is disposed on the outer edge III of the first substrate 212, fragments of the third guard ring pattern 282 may be generated when the display panel is cut along the outer edge III. Since the third guard ring pattern 282 may be separated from the outer edge III by the second distance d2, the generation of the fragments of the third guard ring pattern 282 may be reduced or prevented in the cutting process of the display panel.

The third guard ring pattern 282 may be disposed at a region in which the bonding pad part 22 of the first substrate 212 is disposed, except for the edge region EA is positioned. Since the third guard ring pattern 282 is disposed at the outermost edge of the first substrate 212, the static electricity applied from the outside may be attracted to the third guard ring pattern 282.

The third guard ring pattern 282 may be integrally formed with the second guard ring pattern 272. The third guard ring pattern 282 may be in direct contact with the second guard ring pattern 272. The second guard ring pattern 272 and the third guard ring pattern 282 may be connected to each other near the edge region EA in which the bonding pad part 22 of the first substrate 212 is positioned. The second guard ring pattern 272 and the third guard ring pattern 282 may each be separated by the predetermined interval "g" in the rest of the edge region.

The second guard ring pattern 272 and the third guard ring pattern 282 may be connected to each other in the edge region EA adjacent to a ground terminal 22' of a bonding pad part 22. The third guard ring pattern 282 might not be connected to the second guard ring pattern 272 in the region adjacent to the touch region TA. However, the third guard ring pattern 272 may be connected to the second guard ring pattern 272 in the region adjacent to the ground terminal 22'. Thus, the static electricity may dissipate relatively quickly to the ground terminal 22', for example, through each of the second guard ring pattern 272 and the first guard ring pattern 252.

The static electricity attracted to the third guard ring pattern 282 may be transmitted to the first guard ring pattern 252, for example, through the second guard ring pattern 272. Thus, the static electricity may be dissipated to the ground terminal 22' of the bonding pad part 22. Accordingly, the display device integrated with the touch screen panel 1 may reduce or prevent the static electricity inflow to the side of the display panel. The influence of the static electricity on the display panel may be reduced or eliminated.

The static electricity that is not attracted to the third guard ring pattern 282 may be attracted to each of the first guard ring pattern 252 and the second guard ring pattern 272. Thus, the static electricity may be dissipated to the ground terminal 22' of the bonding pad part 22 connected to the first guard ring pattern 252. Accordingly, since the inflow of the static electricity to the display panel side may be reduced or prevented. The influence of the static electricity on the display panel may be reduced or eliminated.

Figure 7:
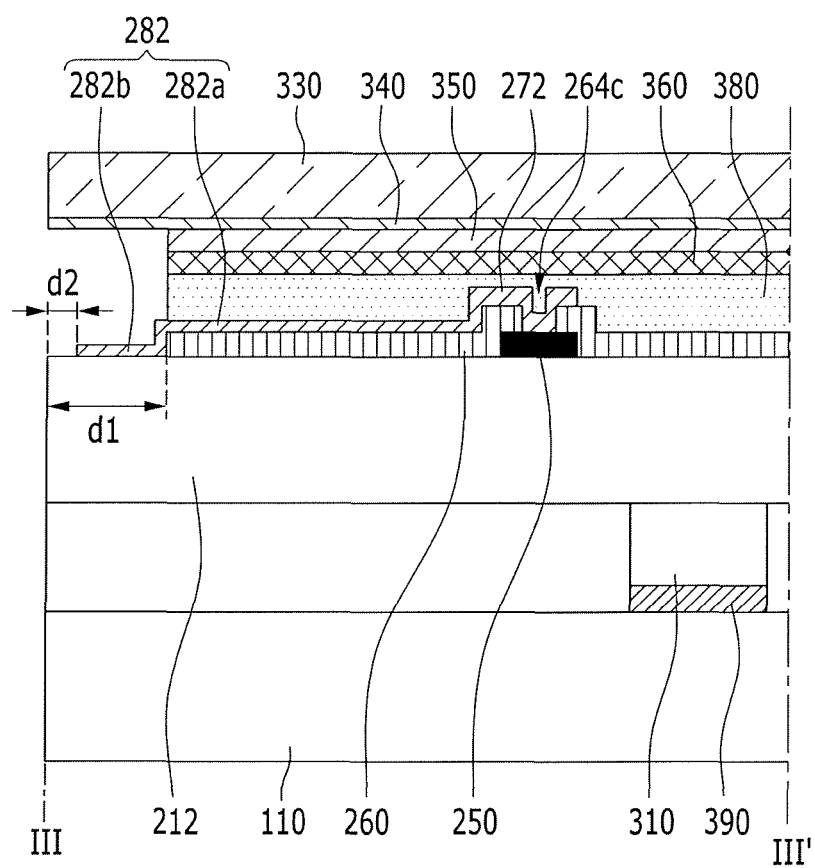
FIG. 7 is a cross-sectional view illustrating a region of a display device integrated with a touch screen panel taken along a line III-III' of FIG. 6 according to an exemplary embodiment of the present invention.

Referring to FIG. 7, the second guard ring pattern 272 may be in direct contact with the first guard ring pattern 252. The second guard ring pattern 272 may be connected to the first guard ring pattern 252, for example, through a contact hole 264c formed in an insulating layer 262. The resistance value due to the bonding of the first guard ring pattern 252 and the second guard ring pattern 272 may be smaller than the resistance value of the first guard ring pattern 252.

The third guard ring pattern 282 may be connected to the second guard ring pattern 272. The third guard ring pattern 282 may be disposed on the outer surface of each of the insulating layer 262 and the first substrate 212. The third guard ring pattern 282 may be adjacent to the outer edge III of the first substrate 212.

The static electricity that may inflow to the first substrate 212 through the edge III from the outside may be attracted to the third guard ring pattern 282. Thus, the third guard ring pattern 282 may reduce or prevent the static electricity from inflowing to the first substrate 212.

The display device integrated with the touch screen panel 1 including the first to third guard ring patterns 252, 272 and 282 may reduce or prevent the static electricity inflow to the display panel side and minimize the influence of the static electricity on the display panel.

While exemplary embodiments of the present invention have been described herein, it is to be understood that the present invention is not limited to the disclosed exemplary embodiments, but, on the contrary, is intended to cover various modifications and equivalent arrangements included within the spirit and scope of the present invention.

What is claimed is:

1. A display apparatus integrated with a touch screen panel, comprising:
    a first substrate including a touch region;
    a first guard ring pattern positioned at a perimeter of the touch region;
    an insulating layer positioned at a perimeter of the first guard ring pattern, the insulating layer separated from an edge of the first substrate by a first distance;
    a second guard ring pattern positioned over each of the first substrate and the insulating layer; and
    a third guard ring pattern in direct contact with the first guard ring pattern through a contact hole positioned in the insulating layer in a position corresponding to a position of the first guard ring pattern.

2. The display apparatus of claim 1, further comprising:
    a plurality of sensing patterns positioned at the touch region;
    a bonding pad part positioned at a first region and connected to an external driving circuit configured to drive the sensing patterns; and
    a plurality of sensing lines connecting the sensing patterns and the bonding pad part to each other, wherein
    the first region is a peripheral area of the touch region.

3. The display apparatus of claim 2, wherein
    the second guard ring pattern is separated from the third guard ring pattern by a predetermined interval.

4. The display apparatus of claim 2, wherein
    the second guard ring pattern and the third guard ring pattern are integrally formed and each include a metal material having a relatively low resistance.

5. The display apparatus of claim 2, wherein
    the second guard ring pattern is connected to the third guard ring pattern in the first region.

6. The display apparatus of claim 2, wherein
    the second guard ring pattern is positioned at a perimeter of the insulating layer at a second region in which the bonding pad part is positioned, the second region excluding the first region.

7. The display apparatus of claim 2, wherein
    the sensing lines and the first guard ring pattern each include a metal material having a relatively low resistance.

8. The display apparatus of claim 2, wherein
    the bonding pad part includes a ground terminal, and
    the first guard ring pattern is connected to the ground terminal.

9. The display apparatus of claim 2, wherein
    the sensing patterns include:
    a plurality of first sensing cells positioned along a first direction to be connected for each row of the sensing patterns positioned in the touch region;
    a plurality of first connection lines connecting the plurality of first sensing cells to each other along the first direction;
    a plurality of second sensing cells positioned along a second direction to be connected for each column of the sensing patterns positioned in the touch region; and
    a plurality of second connection lines connecting the plurality of second sensing cells to each other along the second direction, wherein
    the second direction crosses the first direction.

10. The display apparatus of claim 1, wherein
    the second guard ring pattern is separated from the edge of the first substrate by a second distance, the second distance being smaller than the first distance.

11. The display apparatus of claim 1, further comprising:
a second substrate including a plurality of display elements and disposed below the first substrate; and
a sealant configured to seal each of the first substrate and the second substrate and to enclose the display elements.

12. A display apparatus integrated with a touch screen panel, comprising:
a first substrate including a touch region;
an insulating layer separated from an edge of the first substrate by a first distance; and
a first guard ring pattern disposed on each of the first substrate and an upper surface of the insulating layer and configured to enclose an end of the insulating layer, wherein the first guard ring pattern is in direct contact with a side surface of the insulating layer closest to the edge of the substrate.

13. The display apparatus of claim 12, wherein the first guard ring pattern is positioned at a perimeter of the touch region.

14. The display apparatus of claim 12, wherein the insulating layer is positioned at a perimeter of the first guard ring pattern.

15. The display apparatus of claim 12, further comprising a second guard ring pattern positioned over each of the first substrate and the insulating layer.

16. The display apparatus of claim 12, wherein the first guard ring pattern includes a metal material having a relatively low resistance.

17. A display apparatus, comprising:
a display panel including a substrate having a touch region; and
a touch screen panel disposed on the substrate, wherein an insulating layer is positioned at a perimeter of the touch region and separated from an edge of the substrate; and
a first guard ring pattern disposed on each of the substrate and the insulating layer, wherein the first guard ring pattern extends beyond an outermost edge of the insulating layer in a direction toward an edge of the substrate.

18. The display apparatus of claim 17, wherein the first guard ring pattern includes a metal material having a relatively low resistance.

19. The display apparatus of claim 17, further comprising a second guard ring pattern positioned over each of the substrate and the insulating layer.

* * * * *